United States Patent
Kim et al.

(10) Patent No.: US 6,958,301 B2
(45) Date of Patent: Oct. 25, 2005

(54) METHOD FOR FORMING $Ta_2O_5$ DIELECTRIC LAYER BY USING IN SITU $N_2O$ PLASMA TREATMENT

(75) Inventors: Kyong-Min Kim, Ichon-shi (KR); Han-Sang Song, Ichon-shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 410 days.

(21) Appl. No.: 10/013,528

(22) Filed: Dec. 13, 2001

(65) Prior Publication Data

US 2002/0076946 A1   Jun. 20, 2002

(30) Foreign Application Priority Data

Dec. 14, 2000   (KR) .................. 2000-76625

(51) Int. Cl.$^7$ ............................................. H01L 21/31
(52) U.S. Cl. ...................... 438/785; 438/240; 438/778
(58) Field of Search ................. 438/240, 761, 438/771, 772, 785, 788, 778, 795

(56) References Cited

U.S. PATENT DOCUMENTS

| | | | |
|---|---|---|---|
| 6,376,299 B1 * | 4/2002 | Joo et al. ..................... | 438/240 |
| 6,461,982 B2 * | 10/2002 | DeBoer et al. ............. | 438/778 |
| 2002/0086476 A1 * | 7/2002 | Kim et al. .................. | 438/200 |

* cited by examiner

*Primary Examiner*—Jack Chen
(74) *Attorney, Agent, or Firm*—Mayer, Brown, Rowe & Maw LLP

(57) ABSTRACT

A method for forming a $Ta_2O_5$ dielectric layer by using an atomic layer deposition (ALD) method and an in-situ plasma treatment. The method includes steps of: a) depositing a $Ta_2O_5$ dielectric layer on a substrate; b) performing a plasma treatment using $N_2O$ gas; c) repeating the steps of a) and b) at least one time; and d) annealing the $Ta_2O_5$ dielectric layer for the crystallization of the $Ta_2O_5$ dielectric layer.

10 Claims, 4 Drawing Sheets

$Ta(OC_2H_5)_5 + N_2O$ PLASMA TREATMENT

METHOD FOR FORMING $Ta_2O_5$ DIELECTRIC LAYER BY USING IN SITU $N_2O$ PLASMA TREATMENT

FIELD OF THE INVENTION

The present invention relates to a method for forming a $Ta_2O_5$ dielectric layer and, more particularly, to a method for forming a $Ta_2O_5$ dielectric layer by using an atomic layer deposition (ALD) method and an in-situ plasma treatment.

DESCRIPTION OF THE PRIOR ART

With the increase of integration in a semiconductor device, such as a dynamic random access memory (DRAM), a capacitor having high capacitance in a narrow space and superior electrical characteristics of a low leakage current is needed. In order to meet this need, high dielectric material, such as $Ta_2O_5$, etc., is used as a dielectric layer.

However, a $Ta_2O_5$ dielectric layer, which is deposited by a low pressure chemical vapor deposition (LPCVD) method, has a poor step coverage, and thereby the electrical characteristics of such a capacitor are degraded.

To solve the above-mentioned problem, an atomic layer deposition (ALD) method is introduced. In the ALD method, a plurality of mono atomic layers are deposited, and therefore the step coverage may be improved.

FIGS. 1A to 1D are cross-sectional views illustrating a conventional capacitor manufacturing process.

Referring to FIG. 1A, a polysilicon layer 11 is deposited on a substrate 10 on which predetermined processes have been completed. Thereafter, a native oxide layer (not shown) is removed by using an HF solution or a buffer oxide etchant (BOE), and then a rapid thermal process (RTP) is carried out in an $NH_3$ atmosphere. In case of a semiconductor memory device, transistors, plugs and interlayer insulating layers are formed in the predetermined processes.

Referring to FIG. 1B, a $Ta_2O_5$ dielectric layer 12 is deposited on the polysilicon layer by using the ALD method and an in-situ $O_2$ plasma process.

The $Ta_2O_5$ dielectric layer 12 comprises a plurality of mono atomic layers $12_1$ to $12_n$ repeatedly formed on the polysilicon layer.

Referring to FIG. 1C, the $Ta_2O_5$ dielectric layer 12 is annealed in an $O_2$ atmosphere in order to crystallize the $Ta_2O_5$ dielectric layer 12. As an example, an $O_5$ plasma treatment is performed to crystallize the $Ta_2O_5$ dielectric layer 12.

Referring to FIG. 1D, a top layer 13 is deposited on the $Ta_2O_5$ dielectric layer 12, thereby forming a capacitor including the polysilicon layer 11, the $Ta_2O_5$ dielectric layer 12 and the top layer 13.

The above described conventional method for forming a $Ta_2O_5$ dielectric layer by using the ALD method and the $O_2$ plasma treatment has the following problems.

As shown in FIGS. 1B and 1C, carbon remaining sites "A" are generated in the $Ta_2O_5$ dielectric layer 12 due to the low reactivity of an $O_2$. Moreover, oxygen deficiency sites "B" remain in the $Ta_2O_5$ dielectric layer 12 due to the low activated energy of the oxygen. Accordingly, the electrical characteristics of the capacitor are degraded by the leakage current due to the oxygen deficiency sites.

SUMMARY OF THE INVENTION

It is, therefore, an object of the present invention to provide a method for forming a $Ta_2O_5$ dielectric layer capable of improving an electrical characteristic of the layer by depositing the $Ta_2O_5$ dielectric layer with a plasma atomic layer deposition (ALD) method and an $N_2O$ plasma treatment.

In accordance with an aspect of the present invention, there is provided a method for forming a $Ta_2O_5$ dielectric layer, comprising steps of a) depositing a $Ta_2O_5$ dielectric layer on a substrate prepared in a chamber; b) performing a plasma treatment using $N_2O$ gas; c) repeating the steps of a) and b) at least one time; and d) annealing the $Ta_2O_5$ dielectric layer for the crystallization of the $Ta_2O_5$ dielectric layer.

BRIEF DESCRIPTION OF THE DRAWINGS

Other objects and aspects of the invention will become apparent from the following description of the embodiments with reference to the accompanying drawings, in which.

DETAILED DESCRIPTION OF THE PREFERRED EMBODIMENTS

Hereinafter, a method for forming a $Ta_2O_5$ dielectric layer according to the present invention will be described in detail referring to the accompanying drawings.

FIGS. 2A to 2D are cross-sectional views showing a $Ta_2O_5$ dielectric layer manufacturing process in accordance with the present invention.

Figure 1A:
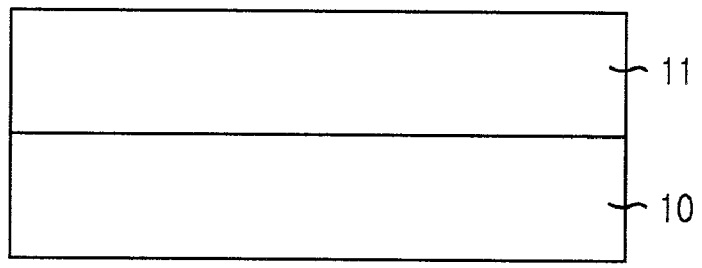
FIGS. 1A to 1D are cross-sectional views illustrating a conventional $Ta_2O_5$ dielectric layer manufacturing process.
Figure 1B:
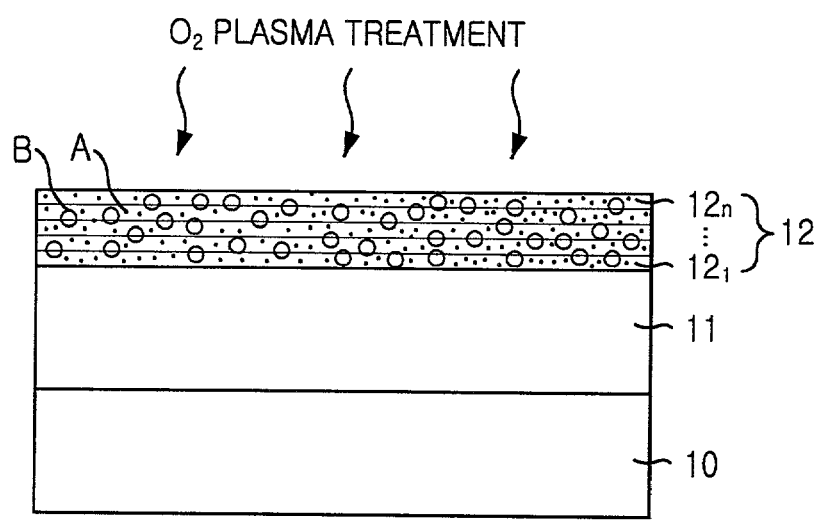
Figure 1C:
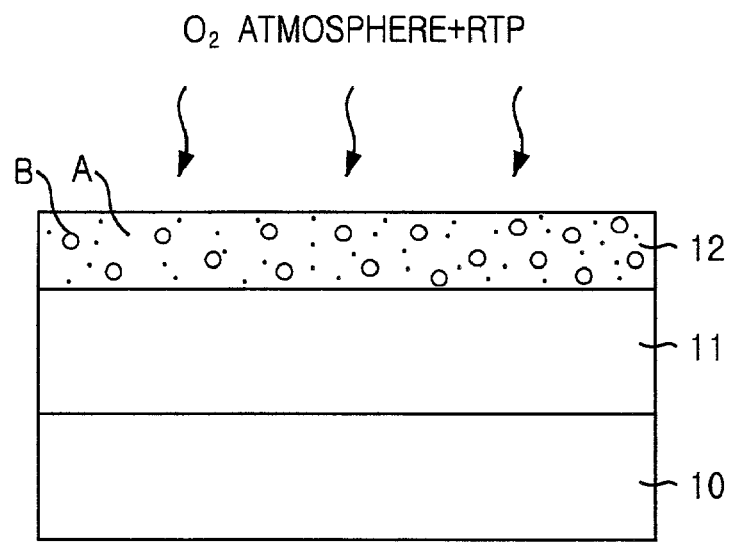
Figure 1D:
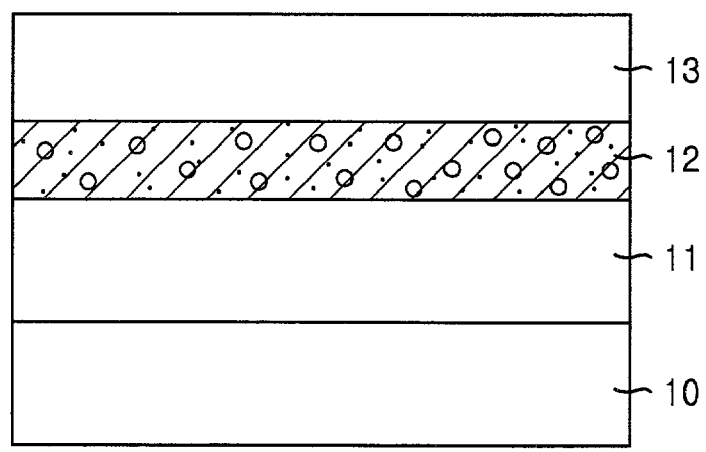
Figure 2A:
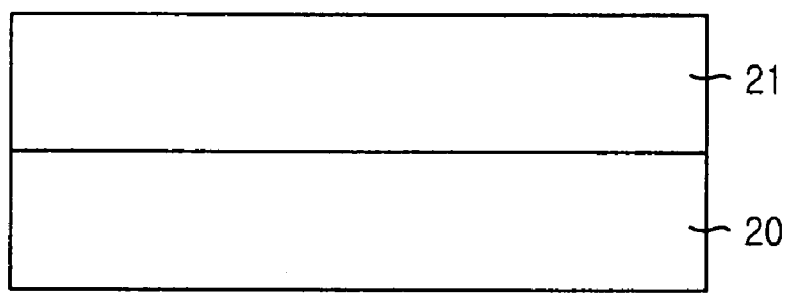
FIGS. 2A to 2D are cross-sectional views showing a $Ta_2O_5$ dielectric layer manufacturing process in accordance with the present invention.

Referring to FIG. 2A, a polysilicon layer 21 is deposited on a substrate 20 on which predetermined processes have been completed. Thereafter, a native oxide layer (not shown) is removed by using an HF solution or a buffer oxide etchant (BOE), and then a rapid thermal process (RTP) is carried out in an $NH_3$ atmosphere. In the case of a semiconductor memory device, transistors, plugs and interlayer insulating layers are formed in the predetermined processes.

Figure 2B:
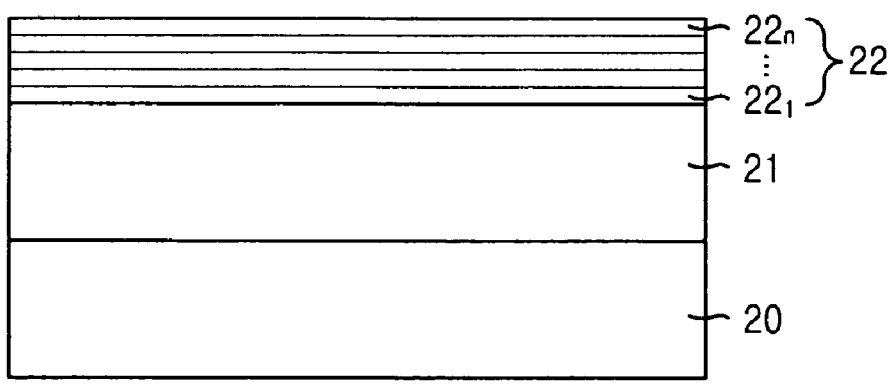

Referring to FIG. 2B, a $Ta_2O_5$ dielectric layer 22, consisting of a plurality of mono atomic layers, $22_1 \ldots 22_n$ is deposited on the polysilicon layer 21 of the substrate 20 prepared in a chamber by the atomic layer deposition (ALD) method and in-situ $N_2O$ plasma treatments. Through the in-situ $N_2O$ plasma treatments, the carbon remaining sites and the oxygen deficiency sites are not generated.

The deposition process of the $Ta_2O_5$ dielectric layer 22 using the ALD method and the in-situ $N_2O$ plasma treatments will now be described in more detail.

First, a mono atomic $Ta_2O_5$ dielectric layer $22_1$ is deposited on the polysilicon layer 21 at a temperature of 200° C. to 300° C. and at a pressure of 0.2 Torr to 1.0 Torr. The $Ta(OC_nH_5)_5$ gas, which is vaporized at a temperature of 170° C. to 190° C., is used as a source gas. After forming the mono atomic $Ta_2O_5$ dielectric layer 221, the chamber is purged with an $N_2$ gas.

Subsequently, the mono atomic $Ta_2O_5$ dielectric layer 221 is treated with the in-situ $N_2O$ plasma treatment. For the in-situ $N_2O$ plasma treatment, an $N_2O$ gas is introduced into the chamber at a rate of 10 sccm to 500 sccm and then plasma is generated under an RF power of 30 W to 500 W. In the preferred embodiment of the present invention, the in-situ $N_2O$ plasma treatment is performed at the same temperature and pressure condition in which the mono atomic $Ta_2O_5$ dielectric layer $22_1$ is deposited, for about 0.1 seconds to 10.0 seconds. After the in-situ $N_2O$ plasma treatment, the chamber is purged with the $N_2$ gas.

With the in-situ $N_2O$ plasma treatment, the carbon atoms, remaining in the mono atomic $Ta_2O_5$ dielectric layer $22_1$, react with the oxygen atoms and form CO or $CO_2$; accordingly, the carbon atoms are removed. Also, the oxygen deficiencies in the mono atomic $Ta_2O_5$ dielectric layer $22_1$ are reduced by the $N_2O$ plasma, which has a high active energy.

Thereafter, the deposition of the mono atomic $Ta_2O_5$ dielectric layers and the in-situ $N_2O$ plasma treatments are performed repeatedly. Accordingly a plurality of mono atomic $Ta_2O_5$ dielectric layers, for example $22_2$ to $22_n$, are formed on the first mono atomic $Ta_2O_5$ dielectric layer $22_1$, thereby forming the $Ta_2O_5$ dielectric layer 22 which has a superior step coverage.

Figure 2C:
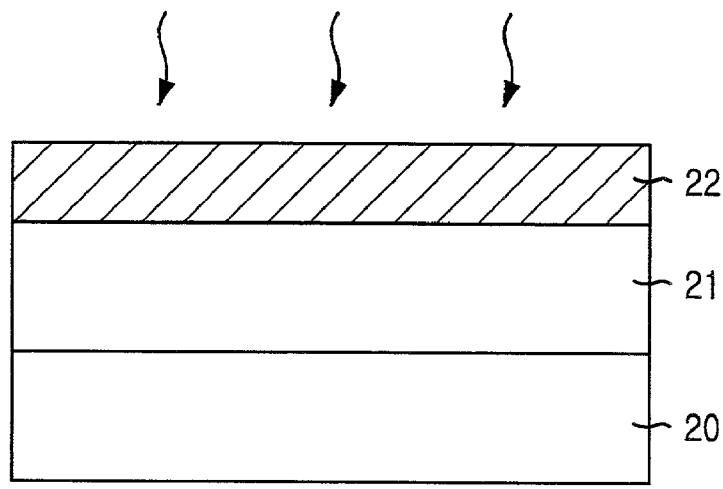

Referring to FIG. 2C, the $Ta_2O_5$ dielectric layer 22 is annealed at a temperature of 650° C. to 800° C. for about 10 minutes to 30 minutes in an $N_2O$ or an $O_2$ atmosphere to crystallize the $Ta_2O_5$ dielectric layer 22.

Figure 2D:
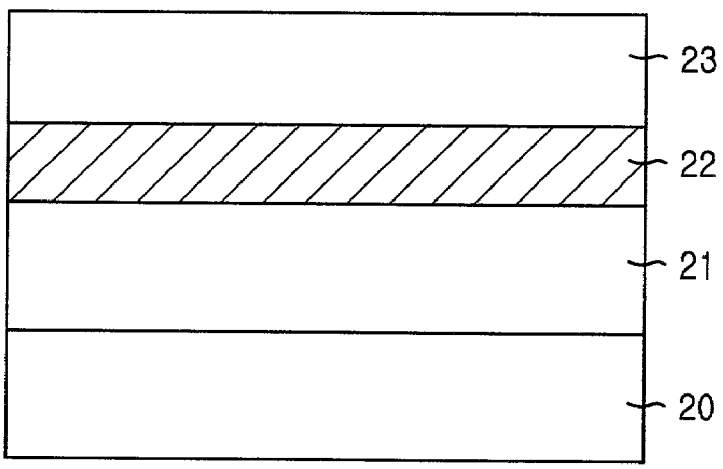

Referring to FIG. 2D, a top electrode 23 is deposited on the $Ta_2O_5$ dielectric layer 22.

As described above, a method for forming a $Ta_2O_5$ dielectric layer in accordance with the present invention improves step coverage by forming a $Ta_2O_5$ dielectric layer through an atomic layer deposition (ALD) method and an $N_2O$ plasma treatment, and improves the quality of the $Ta_2O_5$ dielectric layer, thereby enhancing an electrical characteristic.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for forming a $Ta_2O_5$ dielectric layer, comprising:
   a) depositing a mono-atomic $Ta_2O_5$ layer on a substrate prepared in a chamber;
   b) performing a nitrogen plasma treatment using $N_2O$ gas plasma on said mono-atomic $Ta_2O_5$ layer;
   c) repeating the steps of a) followed by b) at least one time to form a plurality of mono-atomic $Ta_2O_5$ layers as a $Ta_2O_5$ dielectric layer; and
   d) annealing the $Ta_2O_5$ dielectric layer in a $N_2O$ gas atmosphere or an $O_2$ gas atmosphere for crystallization of the $Ta_2O_5$ dielectric layer.

2. The method of claim 1, wherein the steps a) and b) are performed in-situ.

3. The method of claim 1, wherein the step a) includes the steps of:
   a1) flowing $Ta(OC_2H_5)_5$ gas into the chamber; and
   a2) purging the chamber.

4. The method of claim 3, wherein step b) includes flowing the $N_2O$ gas at a rate of 10 sccm to 500 sccm to generate nitrogen plasma.

5. The method of claim 4, wherein an RF power of about 30 W to 500 W is applied to generate the nitrogen plasma.

6. The method of claim 3, wherein the step a1) is carried out at a temperature of approximately 200° C. to 300° C.

7. The method of claim 6, wherein the step a1) is carried out at a pressure of 0.2 Torr to 1.0 Torr.

8. The method of claim 4, wherein the step of flowing the $N_2O$ gas is carried out for about 0.1 to 10.0 seconds.

9. The method of claim 1, wherein the step d) is carried out a temperature of about 650° C. to 800° C.

10. The method of claim 9, wherein the step d) is carried out for about 10 minutes to 30 minutes.

* * * * *